(12) United States Patent
Bae et al.

(10) Patent No.: US 10,208,783 B2
(45) Date of Patent: Feb. 19, 2019

(54) WHEEL NUT AND METHOD OF MANUFACTURING WHEEL NUT

(71) Applicants: Hyundai Motor Company, Seoul (KR); Kia Motors Corporation, Seoul (KR)

(72) Inventors: Chul Hong Bae, Gyeonggi-Do (KR); Kwang Min Yoon, Gyeonggi-do (KR); Young Chan Kim, Gyeonggi-Do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 14/945,622

(22) Filed: Nov. 19, 2015

(65) Prior Publication Data

US 2016/0069379 A1 Mar. 10, 2016

Related U.S. Application Data

(62) Division of application No. 13/835,793, filed on Mar. 15, 2013, now Pat. No. 9,200,664.

(30) Foreign Application Priority Data

Nov. 7, 2012 (KR) .................. 10-2012-0125126

(51) Int. Cl.
*F16B 37/14* (2006.01)
*B21K 1/64* (2006.01)
(Continued)

(52) U.S. Cl.
CPC ............... *F16B 37/14* (2013.01); *B21K 1/64* (2013.01); *C09D 133/00* (2013.01); *C22C 21/00* (2013.01);
(Continued)

(58) Field of Classification Search
CPC ......... B21K 1/64; C09D 133/00; C25D 11/04
(Continued)

(56) References Cited

U.S. PATENT DOCUMENTS 3,242,037 A * 3/1966 Howe ................. B44C 1/16
148/244
4,895,762 A * 1/1990 Tokushima ......... G11B 5/7325
427/130

(Continued)

FOREIGN PATENT DOCUMENTS

JP H08-68867 A 3/1996
JP 11257325 9/1999
(Continued)

*Primary Examiner* — Jie Yang
(74) *Attorney, Agent, or Firm* — Mintz Levin Cohn Ferris Glovsky and Popeo, P.C.; Peter F. Corless

(57) ABSTRACT

Disclosed herein is a method of manufacturing a wheel nut. The method includes annealing an aluminum (Al) alloy material and preheating the annealed Al alloy material. The Al alloy material is also forged to form a wheel nut. Furthermore, the method includes performing an anodizing treatment to form a primary coating on the wheel nut and performing a vacuum deposition to form a secondary coating on the wheel nut. In addition, the method includes performing a surface treatment using powder paint to form a tertiary coating on the wheel nut.

1 Claim, 3 Drawing Sheets

(51) Int. Cl.
    *F16B 33/00*     (2006.01)
    *C09D 133/00*     (2006.01)
    *C25D 11/16*     (2006.01)
    *C25D 11/18*     (2006.01)
    *C22C 21/00*     (2006.01)
    *C25D 11/04*     (2006.01)
    *C25D 11/02*     (2006.01)
    *C23C 14/06*     (2006.01)

(52) U.S. Cl.
    CPC .............. *C25D 11/04* (2013.01); *C25D 11/16* (2013.01); *C25D 11/18* (2013.01); *F16B 33/008* (2013.01); *C23C 14/0605* (2013.01); *C25D 11/026* (2013.01)

(58) Field of Classification Search
    USPC .......................................................... 148/518
    See application file for complete search history.

(56) References Cited

U.S. PATENT DOCUMENTS

| | | |
|---|---|---|
| 5,401,338 A | 3/1995 | Lin et al. |
| 5,884,600 A * | 3/1999 | Wang .................... C25D 11/18 |
| | | 123/193.6 |
| 6,896,785 B2 | 5/2005 | Shatrov et al. |
| 8,608,876 B2 | 12/2013 | Khosla et al. |
| 2006/0000094 A1 | 1/2006 | Garesche et al. |
| 2008/0173378 A1 | 7/2008 | Khosla et al. |
| 2012/0103819 A1* | 5/2012 | Chang ................... C23C 28/322 |
| | | 205/50 |

FOREIGN PATENT DOCUMENTS

| | | |
|---|---|---|
| JP | 2000-326047 A | 11/2000 |
| KR | 10-2003-0077482 A | 10/2003 |
| KR | 10-2004-0093137 A | 11/2004 |
| KR | 10-0973155 B1 | 7/2010 |

* cited by examiner

WHEEL NUT AND METHOD OF MANUFACTURING WHEEL NUT

CROSS-REFERENCE TO RELATED APPLICATION

This application is a divisional application of U.S. application Ser. No. 13/835,793, filed Mar. 15, 2013 which claims under 35 U.S.C. § 119(a) the benefit of Korean Patent Application No. 10-2012-0125126 filed Nov. 7, 2012, the entire contents of which are incorporated herein by reference.

BACKGROUND OF THE INVENTION

1. Field of the Invention

The present invention relates to a wheel nut, which increases corrosion resistance compared to using conventional steel materials, and to a method of manufacturing the wheel nut.

2. Description of the Related Art

Wheel nuts are configured to fix vehicle wheels and also to increase the aesthetic appearance of vehicles together with wheels. Conventional wheel nuts are manufactured by welding a cold forged body (e.g., 600 MPa grade, steel wire) and a deep drawing cap (e.g., steel plate) and performing surface treatment using Chrome (Cr) plating.

As illustrated in FIG. 1, a conventional wheel nut is formed as a two piece structure wherein a cold forged body 10 and a deep drawing cap 30 are welded together and thus a welded "S" portion is formed therebetween. In addition, a wet Cr plating process is performed to improve appearance merchantability.

Most wheel nuts typically have such a two piece structure although the structure may be formed in different shapes. However, the surface of these wheel nuts may be damaged due to tool rotation upon changing the position of tires or exchanging tires, and may cause problems such as corrosion, etc., in proportion to an increase in the distance of driving.

The conventional wheel nut is usually made of steel and thus corrodes upon damage thereto. In particular, since the nut has a two piece structure, the wheel nut may crack at the welded portions upon damage thereto, thereby increasing the speed of corrosion.

SUMMARY

Accordingly, the present invention provides a wheel nut which may increase corrosion resistance compared to using conventional steel materials, and a method of manufacturing the wheel nut.

The present invention provides a method of manufacturing a wheel nut, comprising annealing an aluminum (Al) alloy material and preheating the annealed Al alloy material; forging the preheated Al alloy material, to form a wheel nut; performing primary coating of the wheel nut via anodizing; performing secondary coating of the wheel nut, which was subjected to primary coating, via vacuum deposition as a surface treatment process; and performing tertiary coating of the wheel nut, which was subjected to secondary coating, via surface treatment using a powder paint.

The Al alloy material may be composed mainly of Al and may comprise chrome (Cr): about 0.18~0.28 wt %, copper (Cu): about 1.2~2.0 wt %, iron (Fe): about 0.5 wt % or less (but more than zero), magnesium (Mg): about 2.1~2.9 wt %, manganese (Mn): about 0.3 wt % or less (but more than zero), silicon (Si): about 0.4 wt % or less (but more than zero), titanium (Ti): about 0.2 wt % or less (but more than zero), zinc (Zn): about 5.1~6.1 wt % and other inevitable impurities.

The annealing may be performed via treatment at about 380~420° C. for about 2~5 hr and furnace cooled. The preheating of the annealed Al alloy material may be performed at about 200~300° C. The performing of the primary coating may be performed to form an anodizing layer having a thickness of about 20~70 μm. The performing of the primary coating may comprise subjecting the wheel nut to PEO (Plasma Electrolytic Oxidation) coating. The performing of the secondary coating may be performed via vacuum deposition to form a coating layer having a thickness of about 2~10 μm. The performing of the tertiary coating may be performed using an acrylic powder paint to form a coating layer having a thickness of about 20~50 μm.

In addition, the present invention provides a wheel nut, composed of an Al alloy and comprising, on a surface thereof, a primary coating layer formed of an oxide film, a secondary coating layer formed via vacuum deposition, and a tertiary coating layer formed using a powder paint.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, combustion, plug-in hybrid electric vehicles, hydrogen-powered vehicles and other alternative fuel vehicles (e.g. fuels derived from resources other than petroleum).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Hereinafter, a detailed description will be given of a wheel nut and a method of manufacturing the wheel nut according to exemplary embodiments of the present invention with reference to the accompanying drawings.

Figure 1:
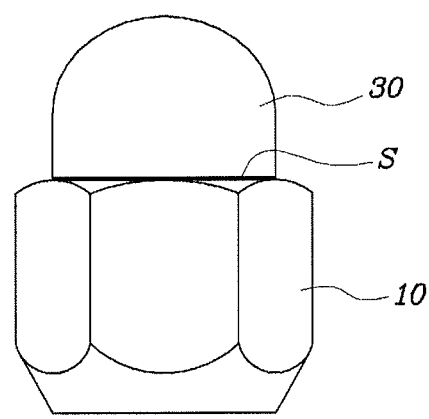
FIG. 1 is an exemplary view illustrating a conventional wheel nut according to a related art.
Figure 2:
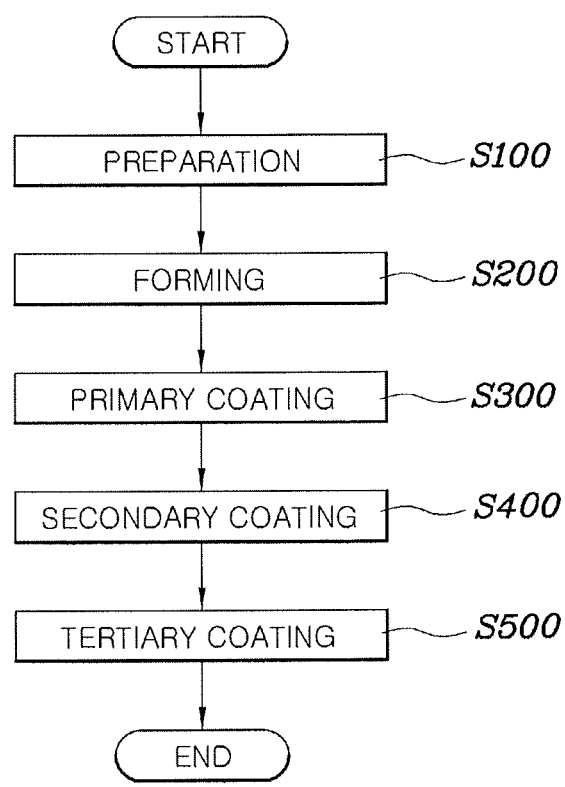
FIG. 2 is an exemplary flowchart illustrating a process of manufacturing a wheel nut according to an exemplary embodiment of the present invention.

FIG. 2 is an exemplary flowchart illustrating a process of manufacturing a wheel nut according to an exemplary embodiment of the present invention. According to the present invention, the wheel nut may be manufactured by annealing an aluminum (Al) alloy material and preheating the annealed Al alloy material (S100); forging the preheated Al alloy material, to form a wheel nut (S200); performing an anodizing treatment to form a primary coating on the wheel nut (S300); performing a vacuum deposition as a surface treatment process to form a secondary coating on the wheel nut, which was subjected to primary coating (S400); and performing a surface treatment using a powder paint to form a tertiary coating of the wheel nut, which was subjected to secondary coating (S500).

Whereas a conventional wheel nut includes two pieces which are welded together, the wheel nut according to the present invention may be manufactured as one structural piece, thus reducing the number of manufacturing processes. Although wet chrome (Cr) plating which is a conventional surface treatment process causes defects due to generation of wastewater and contrary to a heavy metal ban (which prohibits the use of hexavalent chromium Cr(VI)), the present invention adopts an anodizing process, a dry vacuum deposition process, etc., which may generate substantially less wastewater than the conventional method and thus may be considered eco-friendly. In addition, a variety of colors may be shown on the wheel nut in the present invention, and thereby merchantability may increase. In lieu of steel having substantially high specific gravity, the use of Al decreases the weight of a product compared to conventional techniques.

According to the present invention, the wheel nut may be manufactured in an integrated form (e.g., one structure piece) using an Al alloy, and the Al alloy may be composed mainly of Al and may include Cr: about 0.18~0.28 wt %, copper (Cu): about 1.2~2.0 wt %, iron (Fe): about 0.5 wt % or less (but less than zero), magnesium (Mg): about 2.1~2.9 wt %, manganese (Mn): about 0.3 wt % or less (but less than zero), silicon (Si): about 0.4 wt % or less (but less than zero), titanium (Ti): about 0.2 wt % or less (but less than zero), zinc (Zn): about 5.1~6.1 wt % and other potential impurities.

Since an Al wheel nut may undergo surface damage due to tool friction upon connection of the wheel nut, the surface hardness of a material may be considered as an important characteristic of the wheel nut. Hence, in the present embodiment, an ultrahigh strength Al alloy, that is, an A7075 Al alloy, may be used. This alloy may be melted and formed into billets for extraction, followed by performing extrusion to form round bars having a predetermined diameter.

Furthermore, after extrusion, the material may exhibit substantially high strength and substantially low elongation, however, these characteristics may deteriorate formability in a forging process to form a wheel nut, and thus annealing treatment may be performed to decrease strength and increase elongation.

In S100, the Al alloy material may be annealed and preheated. Annealing may be performed via treatment at about 380~420° C. for about 2~5 hr and then furnace cooled (e.g., temperature: about 400±20° C., time: about 2~5 hr, cooling: furnace cooling to about 200° C.).

Subsequently, in S200, the preheated Al alloy material may be forged to form a wheel nut. In this procedure, the Al extruded round bar may be forged using a conventional forging machine for steel wheel nut production. The elongation of the extruded round bar subjected to annealing treatment is about 20%, which is about ½ of elongation of a steel material (about 40%). Thus, the annealed Al alloy material may be preheated to about 200~300° C. To improve formability, the Al extruded round bar may be preheated to about 200~300° C., after which the round bar may be fed into a forging machine to perform forging, thus forming a product. The material formed into a product via hot forging may be subjected to internal thread tap processing necessary for wheel mounting, thus completing a final product.

On the other hand, with the goal of enhancing corrosion resistance and surface hardness as well as showing a desired color, the completed wheel nut may be subjected to surface treatment. In particular, a primary coating may be formed on the wheel nut via anodizing treatment (S300). In the primary coating process (S300), the thickness of the anodizing layer may be about 20~70 μm. In the case of anodizing treatment, PEO (Plasma Electrolytic Oxidation) coating may be performed at higher voltage.

In the anodizing/PEO treatment, alumina ($Al_2O_3$) may be produced via direct reaction with an Al material. Alumina is an oxide exhibiting a substantially high hardness, and exhibits characteristics capable of preventing the material from being imprinted by a load applied from a tool upon mounting/removing a nut. The color shown naturally by the reaction product (e.g., alumina) varies depending on the thickness of the anodizing layer. When the thickness of the anodizing layer is about 20~70 μm, a dark brown to black color is shown, and a color similar to that of a secondary coating layer for manifesting a desired color, for example, a color such as dark black, titanium gray, etc., may be represented. When the thickness of the anodizing layer is less than about 20 μm, the material may be imprinted by a load of a tool, decreasing the quality of the parts. In contrast, when the thickness thereof is greater than about 70 μm the surface hardness increases, and thus the anodizing layer may break down upon use of a tool.

Additionally, a secondary coating (S400) may be formed on the wheel nut subjected to primary coating via vacuum deposition as a surface treatment process. The secondary coating (S400) enables a coating layer having a thickness of about 2~10 μm to be formed via vacuum deposition. The surface treatment process used in secondary coating is vacuum deposition (diamond-like hard carbon (DLC)/sputtering/plasma enhanced chemical vapor deposition (PECVD)), all of which enable the deposition layer to have substantially low friction characteristics and increased wear resistance to distribute a load applied from a tool, thus preventing a material from being imprinted.

When the thickness of the coating layer is less than about 2 μm, the color and surface of the anodizing layer are exposed. In contrast, when the thickness thereof is greater than about 10 μm, the surface hardness increases and thus the treated layer may break down under external impact.

A tertiary coating (S500) may be formed on the wheel nut subjected to secondary coating via a powder paint surface treatment. Tertiary coating (S500) may be performed using an acrylic powder paint to form a coating layer having a thickness of about 20~50 μm.

A powder clear coat used to top coat an Al wheel may be used. Since a layer thickness which satisfies corrosion resistance, chipping resistance, weather resistance, etc., of an Al wheel is about 20~50 μm, clear coating may be performed in the same manner as described above. When the thickness of the clear layer is less than about 20 μm, unsatisfactory coating quality may result. In contrast, when the thickness thereof is greater than about 50 μm, the clear layer may flow down and an orange color may be shown.

The composition of the acrylic powder used in tertiary coating is shown in the following Table 1.

TABLE 1

| Chemical material | CAS No. | Amount (%) |
|---|---|---|
| Acrylic resin | 37953-21-2 | 76~85% |
| Dodecanedioic acid | 000693-23-2 | 11~20% |
| Others | — | 1~10% |

Figure 3:
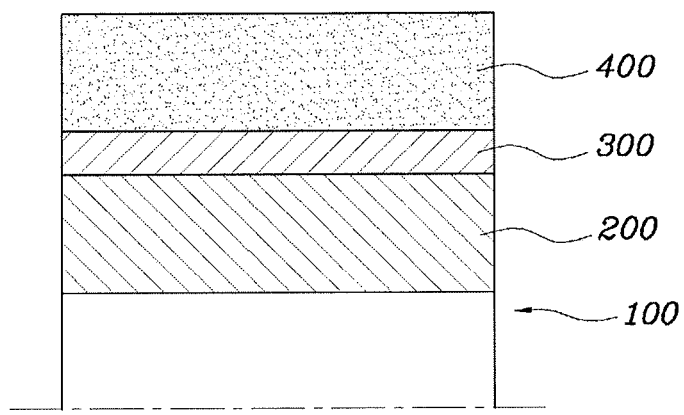
FIG. 3 is an exemplary cross-sectional view illustrating a wheel nut according to an exemplary embodiment of the present invention.

FIG. 3 is an exemplary cross-sectional view showing a wheel nut according to an exemplary embodiment of the present invention. The wheel nut 100 according to the present invention may be composed of an Al alloy, and may include, on the surface thereof, a primary coating layer 200 formed of an oxide film, a secondary coating layer 300 formed via vacuum deposition, and a tertiary coating layer 400 formed using a powder paint. The formation of the respective coating layers is described in detail in the above manufacturing method, and a description thereof is omitted.

In the wheel nut having the above structure and the method of manufacturing the same, ultrahigh strength Al (e.g., 600 MPa grade, A7075) may be extruded, formed via cold forging, and then surface treated (e.g., a three layer structure, anodizing/vacuum deposition/clear coating), thus manufacturing a desired part, thereby exhibiting increased corrosion resistance and increased appearance merchantability, compared to using conventional steel materials. Additionally, the overall weight of a wheel may be decreased, thus improving fuel efficiency.

Specifically, although a conventional wheel nut includes two pieces which are welded, the wheel nut according to the present invention may be manufactured as one structural piece, thus reducing the number of manufacturing processes.

Whereas a conventional surface treatment process, that is, wet Cr plating, may cause defects due to generation of wastewater and contrary to a heavy metal ban (which prohibits the use of Cr(VI)), the present invention adopts an anodizing process, a dry vacuum deposition process, etc., which may generate less wastewater than the conventional method and may thus regarded as eco-friendly. Furthermore, a variety of colors may be shown, thus increasing merchantability. The use of Al instead of steel enables the weight of a product to be reduced compared to conventional techniques.

Although the embodiments of the present invention have been disclosed for illustrative purposes, those skilled in the art will appreciate that a variety of different variations and modifications are possible, without departing from the scope and spirit of the invention as disclosed in the accompanying claims. Accordingly, such variations and modifications should also be understood as falling within the scope of the present invention.

What is claimed is:

1. A wheel nut, composed of an Al alloy and comprising:
a primary coating layer formed on a surface of the wheel nut, wherein the primary coating is formed of an oxide film;
a secondary coating layer formed via vacuum deposition to reduce friction characteristic; and
a tertiary coating layer formed on the wheel nut using a powder paint,
wherein the vacuum deposition forms the secondary coating layer having a thickness of great than 2 μm and less than or equal to 10 μm, and
wherein the primary coating layer of the oxide film, the secondary coating layer formed via the vacuum deposition, and the tertiary coating layer are formed in sequence on the surface of the wheel nut,
wherein the primary coating layer has a thickness of about 20~70 μm and the tertiary coating layer has a thickness of about 20~50 μm.

* * * * *